(12) United States Patent
Yang et al.

(10) Patent No.: US 6,174,815 B1
(45) Date of Patent: Jan. 16, 2001

(54) METHOD FOR PLANARIZING DRAM CELLS

(75) Inventors: Fu-Liang Yang; Chau-Jen Kuo, both of Tainan; Bin Liu, Taipei, all of (TW)

(73) Assignee: Vanguard Semiconductor Corp., Hsinchu (TW)

( * ) Notice: Under 35 U.S.C. 154(b), the term of this patent shall be extended for 0 days.

(21) Appl. No.: 08/957,813

(22) Filed: Oct. 27, 1997

(30) Foreign Application Priority Data

Jul. 24, 1997 (TW) .................................................. 86110519

(51) Int. Cl.⁷ .................................................. H01L 21/311
(52) U.S. Cl. .............................. 438/697; 438/694; 216/79
(58) Field of Search .................... 216/6, 67, 79, 216/80, 88, 89; 438/381, 396, 706, 694, 697–699, 759, 760, 761

(56) References Cited

U.S. PATENT DOCUMENTS

| | | | |
|---|---|---|---|
| 5,324,683 | * 6/1994 | Fitch et al. | 438/422 |
| 5,576,928 | * 11/1996 | Summerfelt et al. | 361/321.1 |
| 5,847,464 | * 12/1998 | Singh et al. | 257/752 |
| 5,872,056 | * 2/1999 | Manning | 438/637 |

* cited by examiner

*Primary Examiner*—Gregory Mills
*Assistant Examiner*—Alva C. Powell
(74) *Attorney, Agent, or Firm*—Rabin & Champagne, P.C.

(57) ABSTRACT

A method for planarizing DRAM cells comprising the steps of providing a silicon substrate having a field oxide layer, an oxide layer and a capacitor formed thereon, then forming a first dielectric layer over the substrate. Next, portions of the first dielectric layer is etched back to form a spacer layer, and then a second dielectric layer is formed over the spacer layer. Thereafter, an insulating layer is formed over the second dielectric layer. Finally, the insulating layer is fully etched back to form a third dielectric layer.

12 Claims, 3 Drawing Sheets

METHOD FOR PLANARIZING DRAM CELLS

BACKGROUND OF THE INVENTION

1. Field of Invention

The present invention relates to a method for planarizing dynamic random access memory (DRAM). More particularly, the present invention relates to a method for planarizing DRAM cells.

2. Description of Related Art

In the manufacture of sub-micron very large scale integrated (VLSI) circuits or ultra large scale integrated (ULSI) circuits, planarization is a very important process. DRAM is a very common and widely used memory. FIGS. 1A through 1C are cross-sectional views showing the progression of manufacturing steps in the planarization of a DRAM cell by a conventional method. First, as shown in FIG. 1A, a silicon substrate 10 having a memory cell circuit region formed thereon is provided. The memory cell circuit region includes a field oxide layer 11, an oxide layer 12 and a capacitor 13.

Next, as shown in FIG. 1B, an insulating layer 14 is deposited over the silicon substrate and the memory cell circuit region.

In a conventional method for forming DRAM cells, since the capacitor 13 is formed above the memory cell circuit region, there will be a height difference between the top of the capacitor 13 and the surrounding memory cell circuit region. In the planarization of sub-half-micron integrated circuits, if the step height hc (shown in FIG. 1A) of a capacitor 13 is bigger than or equal to about 0.5 µm, planarization becomes difficult, and may lead to poor structural quality in subsequent processes.

Next, for example, as shown in FIG. 1C, a subsequent metallization process is performed. In the metallization process, a photoresist layer is formed over the insulating layer 14, then light is shone onto the photoresist layer through a photomask having a desired pattern for forming conducting wires 15 and 16. Since the photoresist layer will react chemically when exposed to light, after development with chemicals, the desired etching pattern is formed. However, as mentioned before, because the difference in height between the top of the capacitor and its surrounding areas is big, there will be insufficient depth of focus during light exposure which may lead to defocusing. Therefore, pattern on the photoresist layer will be properly transferred and may ultimately lead to the deformation of conducting wires after the metallic etching operation. As a result, the resistance of a conductive wire such as 15 becomes larger.

To solve the problems caused by a difference in height levels, a chemical-mechanical polishing operation is generally applied. The chemical-mechanical polishing method is a global planarization method. Principly, the chemical-mechanical polishing method combines mechanical polishing with suitable chemical reagents, a slurry which is a mixture of colloidal silica and potassium hydroxide (KOH), and operates under a suitably controlled set of parameters to obtain an optimal planarity. The set of controlling parameters includes: slurry composition, magnitude of pressure on the wafer, rotational speed of the polishing head, material of the polishing pad, size distribution of polishing particles, working temperature, pH and so on. In general, all these parameters need to be changed according to the kind of material to be polished. Hence, chemical-mechanical polishing is a hard to control, costly and time consuming global planarization process. In light of the foregoing, there is a need in the art to improve the planarization method.

SUMMARY OF THE INVENTION

Accordingly, the present invention is directed to provide a method for planarizing DRAM cells that solve the problems caused by difference in height levels within the memory cell circuit regions, and ensure a consistant quality in subsequent processes.

To achieve these and other advantages and in accordance with the purpose of the invention, as embodied and broadly described herein, the invention includes a method for planarizing DRAM cells comprising the steps of providing a silicon substrate having a semiconductor component, a field oxide layer, an oxide layer and a capacitor formed thereon; forming a first dielectric layer over the substrate; etching back portions of the first dielectric layer to form a spacer layer; forming a second dielectric layer over the spacer layer; forming an insulating layer over the second dielectric layer; and fully etching back the insulating layer, and etching back portions of the second dielectric layer to form a third dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
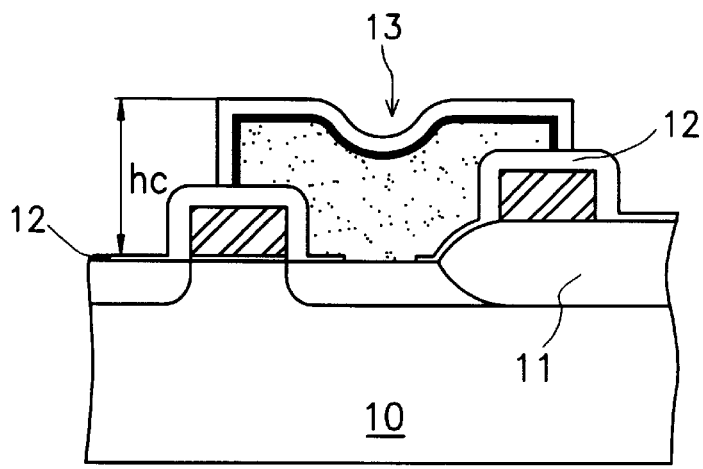
FIGS. 1A through 1C are cross-sectional views showing the progression of manufacturing steps in the planarization of a DRAM cell by a conventional method.
Figure 1B:
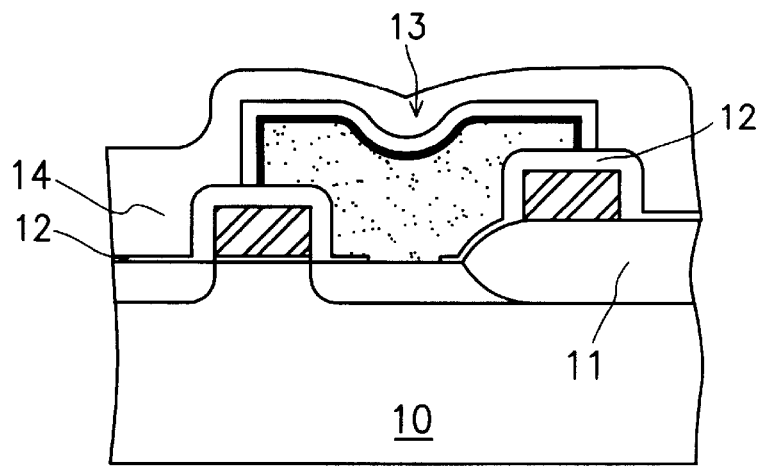
Figure 1C:
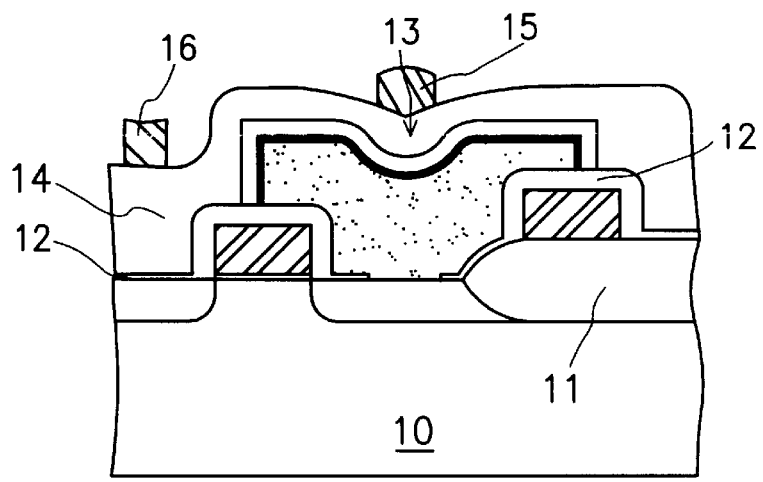

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing the progression of manufacturing steps in the planarization of a DRAM cell according to one preferred embodiment of the invention. In accordance with the invention, there is provided method for planarizing a dielectric layer that utilises the etching of a spacer and the relative etching back of a borophosphosilicate glass (BPSG) and a spin-on-glass (SOG) layer, or a BPSG and a photo resist (PR) layer, to planarize the dielectric thin film above a capacitor.

Figure 2A:
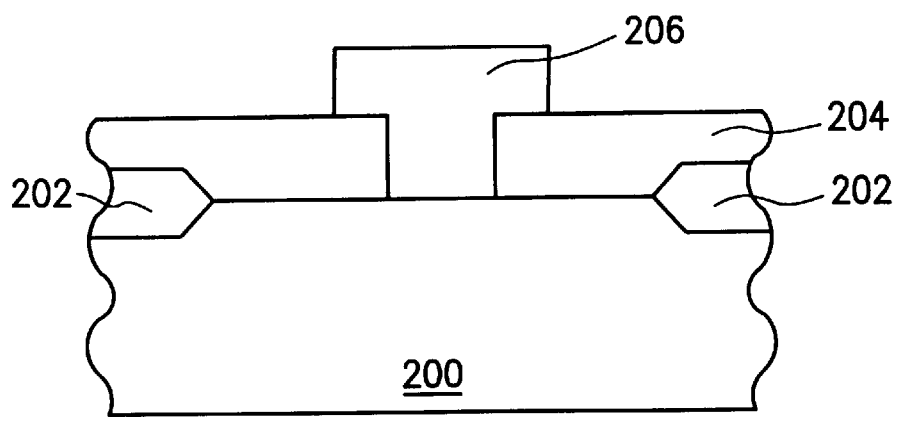
FIGS. 2A through 2F are cross-sectional views showing the progression of manufacturing steps in the planarization of a DRAM cell according to one preferred embodiment of the invention.

In FIG. 2A, a memory cell circuit region of a DRAM is shown. First, a silicon substrate 200 having a semiconductor component (for example, a MOS transistor, not shown in FIG. 2A), a field oxide layer 202, an oxide layer 204 and a capacitor 206 formed thereon is provided.

Figure 2B:
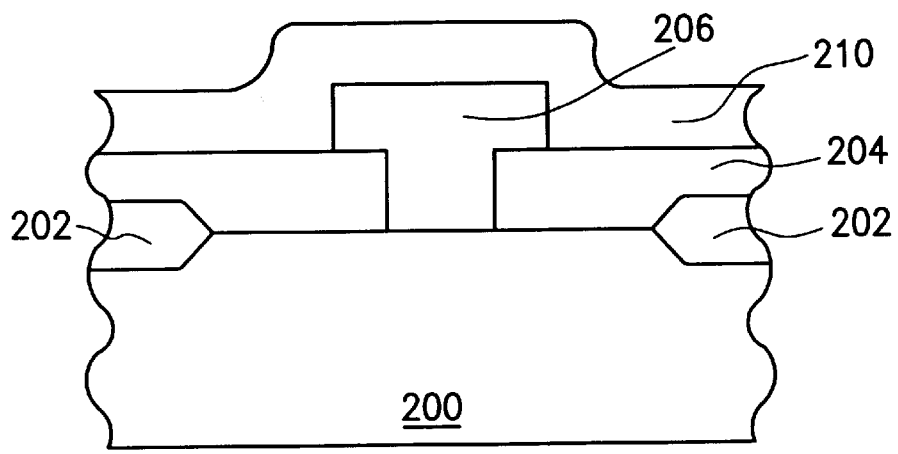

Next, as shown in FIG. 2B, using a conventional technique, a first dielectric layer 210 is deposited over the substrate 200, the oxide layer 204 and the capacitor 206. For example, a chemical vapor deposition (CVD) method can be used to deposit a BPSG layer, or by the method of passing a carrier gas such as nitrogen into a tetra-ethyl-orthosilicate (TEOS) liquid to raise the differential pressure in the vapor phase of a liquid state compound to deposit a TEOS layer.

Figure 2C:
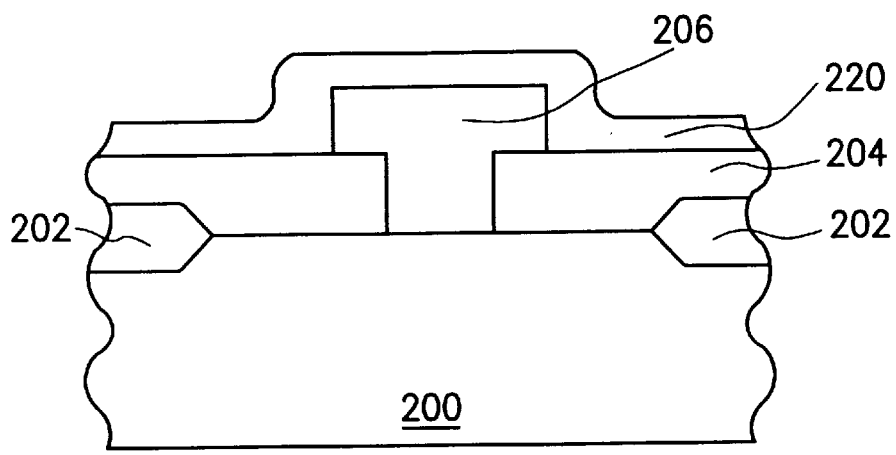

Next, as shown in FIG. 2C, the first dielectric layer 210 is partially etched back, for example, using a dry etching method, to form a spacer layer 220. Not all of the first dielectric layer 210 above the capacitor 206 and the oxide layer 204 is removed by the etching back process, and a thin layer still covers the top of the capacitor 206 forming the spacer layer 220 as shown.

Figure 2D:
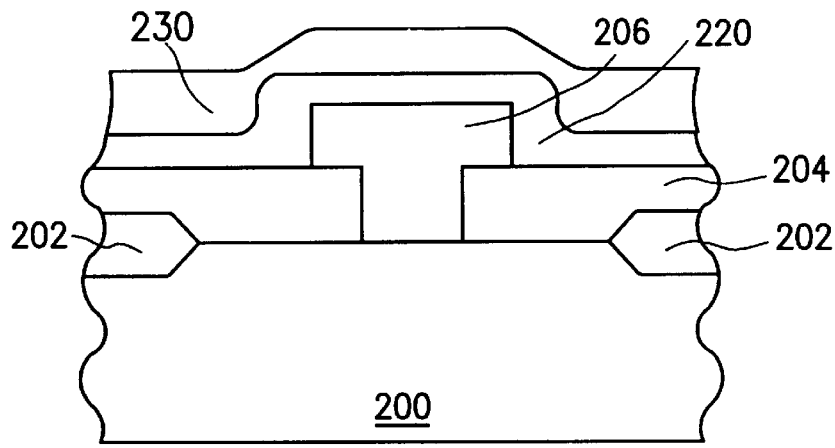

Next, as shown in FIG. 2D, a second dielectric layer 230 is formed over the spacer layer 220. For example, a CVD method is used to deposit a BPSG layer. The second dielectric layer 230 is used as a buffer layer in subsequent etching back process, and therefore its thickness must be sufficient for the purpose.

Figure 2E:
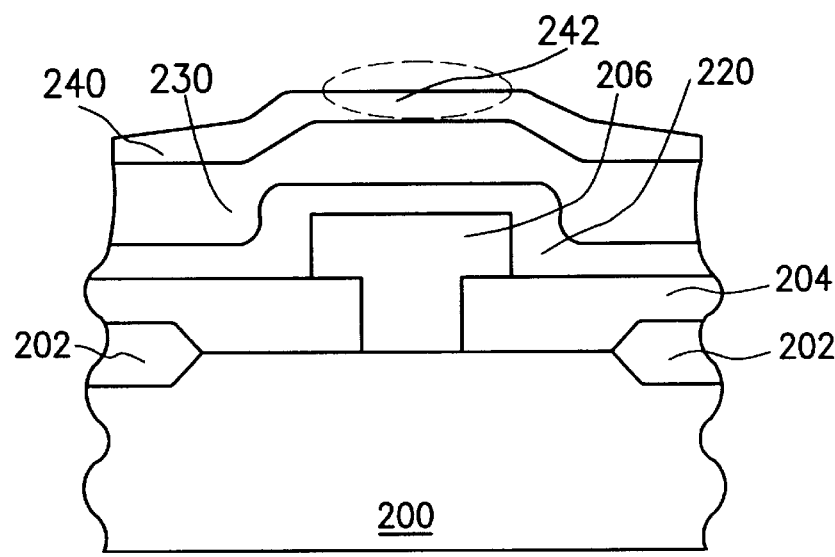

Thereafter, as shown in FIG. 2E, an insulating layer 240 is formed over the second dielectric layer 230. For example, a spin coating method is used to coat a SOG or a PR layer over the second dielectric layer 230.

Figure 2F:
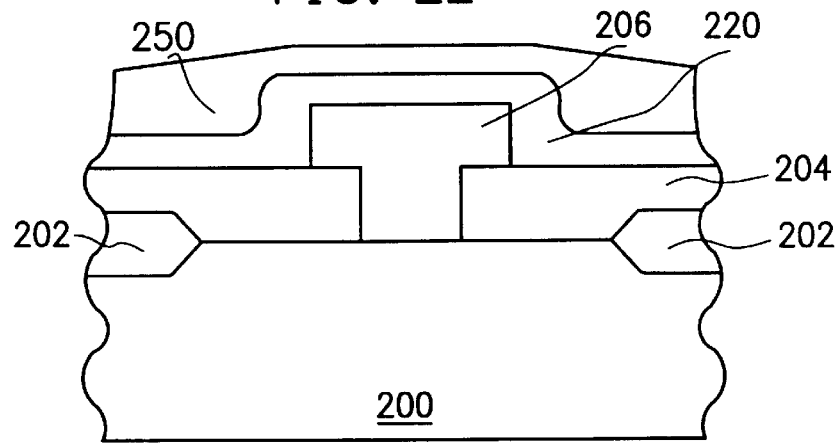

Finally, as shown in FIG. 2F, the insulating layer 240 is fully etched back. During the process, the insulating layer 24 is fully etched back and at the same time portions of the second dielectric layer 230 is also etched back to form a third dielectric layer 250. In this embodiment, the insulating layer 240 is fully etched back, for example, by using a dry etching method. The etching rate for BPSG and SOG layer, or BPSG and PR layer is slightly different, and their etching rate ratio is about 1~1.5:1. When the insulating layer 240 in the area 242 above the capacitor 206 is fully etched exposing portions of the dielectric layer 230, both the insulating layer 240 and the second dielectric layer 230 will be etched simultaneously until the insulating layer 240 is completely removed. Since the second dielectric layer 230 has a higher etching rate than the insulating layer 240, a third dielectric layer 250 having a relatively planar surface 255 is obtained. The third dielectric layer 250 is a BPSG layer.

From the above description of the preferred embodiment of the invention, it can be noted that the invention utilizes only the etching of a spacer and the etching of BPSG and SOG layers(or PR layer) making use of their difference in relative etching rate to achieve the planarization needed for the dielectric thin film above a capacitor. Therefore, relative to a conventional CNIP method, it is much simpler and more cost effective to implement.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for planarizing semiconductor devices, comprising the steps of:
    providing a silicon substrate having a surface topography;
    forming a stacked layer free of conductive material, including:
       forming a dielectric layer over the substrate, and etching back portions of the first dielectric layer to form a spacer layer;
       forming a second dielectric layer having an upper surface and a lower surface opposite the upper surface, the lower surface being formed only directly on the conformal spacer layer; and
       forming an insulating layer having an upper surface and a lower surface opposite the upper surface, the lower surface being formed only directly on the upper surface of the second dielectric layer; and
       fully etching back the insulating layer, and etching back portions of the second dielectric layer to form a planar surface, with the insulating layer having an etching rate greater than the etching rate of the second dielectric layer.

2. The method of claim 1, wherein the step of forming the first dielectric layer includes depositing borophosphosilicate glass.

3. The method of claim 1, wherein the step of forming the first dielectric layer includes depositing tetra-ethyl-orthosilicate (TEOS).

4. The method of claim 1, wherein the step of etching back the first dielectric layer includes using a dry etching method.

5. The method of claim 1, wherein the step of forming the second dielectric layer includes depositing borophosphosilicate glass.

6. The method of claim 1, wherein the step of forming the insulating layer includes spin coating spin on glass.

7. The method of claim 1, wherein the step of forming the insulating layer includes depositing photo resist.

8. The method of claim 1, wherein the step of fully etching back the insulating layer and etching back portions of the second dielectric layer includes the substeps of:
    etching the insulating layer using a dry etching method;
    simultaneously etching the insulating layer and the second dielectric layer when the second dielectric layer is partially exposed; and
    continuously etching the insulating layer and the second dielectric layer until the whole insulating layer is etched away forming a third dielectric layer.

9. The method of claim 1, wherein the step of fully etching back the insulating layer, and etching back portions of the second dielectric layer includes etching a borophosphosilcate glass layer.

10. A method for planarizing semiconductor devices, comprising the steps of:
    providing a silicon substrate having a surface topography;
    forming a stacked insulative layer free of conductive material, including:
       forming a conformal first dielectric layer over the substrate's surface topography;
       forming a second dielectric layer only over the conformal first dielectric layer; the second dielectric layer having an exposed nonplanar surface; and
       forming an insulating layer only directly on the nonplanar surface of the second dielectric layer; and
       fully etching back the insulating layer, and etching back portions of the second dielectric layer to form a planar surface, with the insulating layer, having an etching rate greater than the etching rate of the second dielectric layer.

11. The method of claim 10, wherein the step of fully etching back the insulating layer and etching back portions of the second dielectric layer includes the substeps of:
    etching the insulating layer using a dry etching method;
    simultaneously etching the insulating layer and the second dielectric layer when the second dielectric layer is partially exposed; and
    continuously etching the insulating layer and the second dielectric layer until the whole insulating layer is etched away, forming a third dielectric layer.

12. A method for planarizing semiconductor devices, comprising the steps of:

providing a silicon substrate having a surface topography;

forming a conformal first dielectric layer having a lower surface over the substrate's surface topography;

etching back portions of the first dielectric layer to form a conformal spacer layer;

forming a second dielectric layer having a nonplanar upper surface, such that the nonplanar upper surface and a lower surface opposite the upper surface, such that the nonplanar upper surface of the conformal spacer layer is contacted only by the second lower surface; and forming an insulating layer having an upper surface and a lower surface opposite the upper surface, such that the nonplanar upper surface of the second dielectric layer is contacted only by the insulating layer lower surface, wherein the conformal spacer layer, the second dielectric layer and the insulating layer together form an insulating stacked layer that is conductor-free between the lower surface of the first dielectric layer and the upper surface of the insulating layer; and fully etching back the insulating layer, and etching back portions of the second dielectric layer to form a planar surface, with the insulating layer having an etching rate greater than the etching rate of the second dielectric layer.

* * * * *